(12) United States Patent  (10) Patent No.: US 9,921,482 B2
Kajimaya et al.  (45) Date of Patent: Mar. 20, 2018

(54) EXPOSURE DEVICE AND LIGHTING UNIT

(71) Applicant: V TECHNOLOGY CO., LTD., Yokohama-shi, Kanagawa (JP)

(72) Inventors: Koichi Kajimaya, Yokohama (JP); Michinobu Mizumura, Yokohama (JP); Makoto Hatanaka, Yokohama (JP)

(73) Assignee: V TECHNOLOGY CO., LTD., Yokohama-shi (JP)

( * ) Notice: Subject to any disclaimer, the term of this patent is extended or adjusted under 35 U.S.C. 154(b) by 0 days.

(21) Appl. No.: 14/902,044

(22) PCT Filed: Jun. 16, 2014

(86) PCT No.: PCT/JP2014/003213
§ 371 (c)(1),
(2) Date: Dec. 30, 2015

(87) PCT Pub. No.: WO2015/001736
PCT Pub. Date: Jan. 8, 2015

(65) Prior Publication Data
US 2016/0223913 A1   Aug. 4, 2016

(30) Foreign Application Priority Data
Jul. 1, 2013   (JP) .................. 2013-138100

(51) Int. Cl.
*G03B 27/42* (2006.01)
*G03F 7/20* (2006.01)
(52) U.S. Cl.
CPC ............ *G03F 7/7015* (2013.01); *G03F 7/201* (2013.01); *G03F 7/70275* (2013.01)
(58) Field of Classification Search
CPC ............... G03F 7/7015; G03F 7/70075; G03F 7/70258; G03F 7/201; G03F 7/70275;
(Continued)

(56) References Cited

U.S. PATENT DOCUMENTS

2005/0024477 A1* 2/2005 Noguchi ............ G03F 7/70791
347/241
2005/0219493 A1  10/2005 Oshida et al.
(Continued)

FOREIGN PATENT DOCUMENTS

JP   2002-373448 A  12/2002
JP   2004-39871 A    2/2004
(Continued)

OTHER PUBLICATIONS

International Search Report of PCT/JP2014/003213 dated Sep. 9, 2014.

*Primary Examiner* — Mesfin Asfaw
(74) *Attorney, Agent, or Firm* — Sughrue Mion, PLLC

(57) ABSTRACT

The present invention relates to an exposure device which forms an image of a pattern on a mask onto a substrate with microlens arrays to expose the substrate, and reduces a size of an lighting unit which emits an exposure light. Microlens arrays include plural microlenses which are arranged two-dimensionally and arranged in a direction intersecting a movement direction. Lighting unit includes an LD array bar in which plural laser diodes are arranged, and lighting optical system which transforms plural emitted lights emitted from the plural laser diodes into an exposure flux having a slit form. The slit form spreads across plural pieces of the microlenses, and which, with respect to the movement direction, is limited in an area not reaching a microlens arranged in an adjacent row in the movement direction, and illuminates plural microlenses arranged in a row with an exposure light by the exposure light flux.

6 Claims, 10 Drawing Sheets

(58) Field of Classification Search
CPC ... G03F 7/704; G03F 7/20; G03F 7/70; G03F 7/70025; G03F 7/7005; G03F 7/70458; G02B 19/0047; G02B 19/0057; G02B 27/0961; G02B 3/00; G02B 3/0006
See application file for complete search history.

(56) References Cited

U.S. PATENT DOCUMENTS

| | | |
|---|---|---|
| 2009/0237955 A1 | 9/2009 | Mukai |
| 2010/0195078 A1* | 8/2010 | Horiuchi ............ G03F 7/70558 355/71 |
| 2014/0168648 A1 | 6/2014 | Hashimoto |

FOREIGN PATENT DOCUMENTS

| | | |
|---|---|---|
| JP | 2007-3829 A | 1/2007 |
| JP | 2008-152039 A | 7/2008 |
| JP | 2009-229721 A | 10/2009 |
| JP | 2009-277900 A | 11/2009 |
| JP | 2012-220592 A | 11/2012 |
| JP | 2013-97310 A | 5/2013 |
| JP | 2013-98432 A | 5/2013 |
| WO | 2006/137486 A1 | 12/2006 |
| WO | 2012/137785 A1 | 10/2012 |
| WO | 2013/021985 A1 | 2/2013 |

* cited by examiner

EXPOSURE DEVICE AND LIGHTING UNIT

CROSS REFERENCE TO RELATED APPLICATIONS

This application is a National Stage of International Application No. PCT/JP2014/003213 filed Jun. 16, 2014, claiming priority based on Japanese Patent Application No. 2013-138100, filed Jul. 1, 2013, the contents of all of which are incorporated herein by reference in their entirety.

TECHNICAL FIELD

The present invention is related to an exposure device which forms an image of an exposure pattern on a mask onto a substrate by microlens arrays to expose the substrate, and an lighting unit which emits an exposure light to illuminate the mask in performing the exposure.

BACKGROUND ART

An exposure device which copies an exposure pattern on a mask onto a substrate by using microlens arrays in which microlenses are arranged two-dimensionally as an image forming optical system has been proposed (see Patent Literature 1), and has been practically implemented in manufacturing processes for liquid crystal panel and the like. In an exposure device of such type, an lighting unit which emits an exposure light to illuminate a mask is arranged above the mask on which an exposure pattern is formed, and microlens arrays are arranged between the mask and a substrate on which photosensitive resist is applied. And, the exposure device forms an image of the exposure pattern on the mask onto the substrate with the microlens arrays while moving the lighting unit and the microlens arrays relatively to the mask and the substrate, so that the substrate is exposed (see, Patent Literature 2). With this, it is possible to expose a substrate having a large area exceeding an exposure area of the microlens arrays when standing still.

In addition, Patent Literature 3 describes a configuration of lighting unit including an optical source and an optical system which are suitable for an exposure device of such type. An lighting unit described in this Patent Literature 3 has a configuration in which the many high pressure mercury lamps are arranged two-dimensionally, and lights emitted from those many high pressure mercury lamps are transmitted through lenses and reflection mirrors to illuminate a mask.

PRIOR ART LITERATURES

Patent Literatures

Patent Literature 1: Japanese Laid-Open Patent Literature No. 2007-3829.
Patent Literature 2: Japanese Laid-Open Patent Literature No. 2012-220592.
Patent Literature 3: Japanese Laid-Open Patent Literature No. 2013-97310.

ABSTRACT OF THE INVENTION

Technical Problem

In a case of an exposure device of the above-described type, it is possible to form an image of an exposure pattern on a mask onto a substrate in a high resolution by applying microlens arrays, and in addition, the mask and the substrate are arranged closely, for example, in the order of 10 mm, and the microlens arrays are arranged therebetween, thereby realizing reduction in height.

However, as for the lighting unit, conventionally, many high pressure mercury lamps are arranged, an optical system having a large size is required, and only a height of the lighting unit itself reaches, for example, the order of 2 m, and so on, and thus, the lighting unit has been a hamper for reduction in size and reduction in height of the exposure device.

In view of the foregoing, it is an object of the present invention to provide an lighting unit which is reduced in size and in height, and an exposure device which is reduced in size and in height by using the lighting unit.

Solution to Problem

An exposure device according to the present invention to obtain the above-describe object includes:
an lighting unit that emits an exposure light;
a mask that includes an exposure pattern formed thereon and receives a radiation of the exposure light from the lighting unit;
microlens arrays that target the mask as a subject; and
a movement mechanism that moves the lighting unit and the microlens arrays in a predetermined movement direction relatively to both of the mask and a substrate onto which an image of the exposure pattern on the mask is formed by the microlens arrays, wherein
the exposure device exposes the substrate in a pattern according to the exposure pattern on the mask across an area on the substrate which area has a spread exceeding an exposure area of the microlens arrays when standing still through the relative movement in the movement direction by the moving mechanism,
the microlens arrays include a plurality of microlenses which are arranged two-dimensionally while including an arrangement in an intersecting direction intersecting the movement direction, and
the lighting unit includes:
a light emitting element array that includes a plurality of light emitting elements arranged therein; and
an lighting optical system that transforms plural emitted lights emitted from the plurality of light emitting elements included in the light emitting element array into an exposure light flux which, with respect to the intersecting direction, spreads across plural microlenses arranged in the intersecting direction, and which, with respect to the movement direction, is limited in an area not reaching a microlens arranged in an adjacent row in the movement direction, and that guides the exposure light flux to plural microlenses arranged in the intersecting direction.

In here, typically, laser diodes may be applied as the above-described light emitting elements, and a laser diode array may be applied as the light emitting element array.

The lighting unit according to the present invention applies the light emitting element array, transforms plural emitted lights emitted therefrom into the exposure light flux having the slit form and guides the exposure light flux to the plural microlenses arranged in the above-described intersecting direction. With this, significant reduction in height is obtained, compared to a conventional lighting unit in which many mercury lamps are arranged two-dimensionally.

In addition, since the exposure light by the exposure light flux having the slit form is emitted while aiming the microlenses arranged in the intersecting direction as a target, a width of the exposure light may be limited in a width in which an error of alignment and the like are added to an efficient aperture of the microlens. When an exposure light having such a limited width as described is applied, a ratio which is used as an effective exposure light of the emitted lights is increased, and thus, high efficiency and energy conservation are also obtained.

Here, in the exposure device according to the present invention, it is preferable that the lighting unit includes plural sets of the light emitting element arrays, and the lighting optical system is an optical system which, with respect to each single set of the plural light emitting element arrays, transforms plural emitted lights emitted from a single set of the light emitting element array into a single of the exposure light flux, and guides each of the exposure light fluxes each corresponding to each of the plural sets of the light emitting element arrays to each of plural rows each of which includes the plural microlenses arranged in the intersecting direction and which are different from one another with respect to the movement direction.

Such configuration that the microlenses in individual rows of the arrays are irradiated by the respective plural exposure light fluxes with reference to the movement direction is applied, it is possible to increase an exposure light amount for the substrate and it is possible to complete the exposure in a short exposure duration.

In addition, in the exposure device according to the present invention, it is preferable that the lighting optical system includes:
a light flux transformation optical system which is arranged according to the light emitting element array, to which plural emitted lights emitted from the plurality of light emitting elements included in the light emitting element array are incident, and which transforms the incident lights into a slit light flux having a slit form, and emits the slit light flux; and
a light projection optical system to which the slit light flux emitted from the light flux transformation optical system is incident, and which transforms the incident slit light flux into the exposure light.

Here, as the above-described light flux transformation optical system, typically, a rod lens which is processed to have the form of the above-described slit flux may be used.

When the above-described light flux transformation optical system and the light projection optical system are applied, it is possible to obtain an exposure light flux whose light amount is uniformed in the light flux, and an exposure in which the exposure unevenness is small is obtained.

In the exposure device according to the present invention, it is preferable that the lighting unit further includes a supporting substrate to which the light emitting element array is fixed and which is made of a material allowing an emitted light emitted from the light emitting element array to transmit therethrough, and
the lighting optical system includes a reflection optical system which is arranged according to the light emitting element array, is fixed on the supporting substrate to extend along the light emitting element array, and reflects plural emitted lights emitted from the plurality of light emitting elements included in the light emitting array to cause the reflected lights to transmit through the supporting substrate.

Here, as the above-described reflection optical system, a reflection mirror, a reflection prism or the like may be applied.

When this configuration is applied, it is possible to arrange plural sets of the light emitting element arrays in a high precision manner, and in addition, it is possible to adjust optical axes of emitted lights in a high precision manner and easily by a fine adjustment of a position of the reflection optical system before fixed.

In addition, in the exposure device according to the present invention, it is also preferable form that the lighting unit further includes a supporting substrate to which the light emitting element array is fixed and which is made of a material allowing an emitted light emitted from the light emitting element array to transmit therethrough, and
the light emitting element array is fixed on the supporting substrate in a posture in which plural emitted lights are emitted from the plurality of light emitting elements included in the light emitting element array toward the supporting substrate.

Also by applying this configuration, it is possible to arrange plural sets of the light emitting element arrays in a high precision manner.

In addition, an lighting unit according to the present invention to obtain the above-described object is an lighting unit that, when forming an image of an exposure pattern on a mask having the exposure pattern formed thereon onto a substrate by microlens arrays and moving the microlens arrays in a predetermined movement direction relatively to the mask and the substrate, illuminates the mask while emitting an exposure light and moving in the movement direction together with the microlens arrays, wherein
the microlens arrays include a plurality of microlenses which are arranged two-dimensionally while including an arrangement in an intersecting direction intersecting the movement direction, and
the lighting unit includes:
a light emitting element array that includes a plurality of light emitting elements arranged therein; and
an lighting optical system that transforms plural emitted lights emitted from the plurality of light emitting elements included in the light emitting element array into an exposure light flux which, with respect to the intersecting direction, spreads across plural microlenses arranged in the intersecting direction, and which, with respect to the movement direction, is limited in an area not reaching a microlens arranged in an adjacent row in the movement direction, and that guides the exposure light flux to plural microlenses arranged in the intersecting direction.

Advantageous Effects of Invention

According to the above-described present invention, significant reduction in height of the lighting unit is obtained.

BEST MODE FOR CARRYING OUT THE INVENTION

In the following, an embodiment according to the present invention will be explained.

Figure 1:
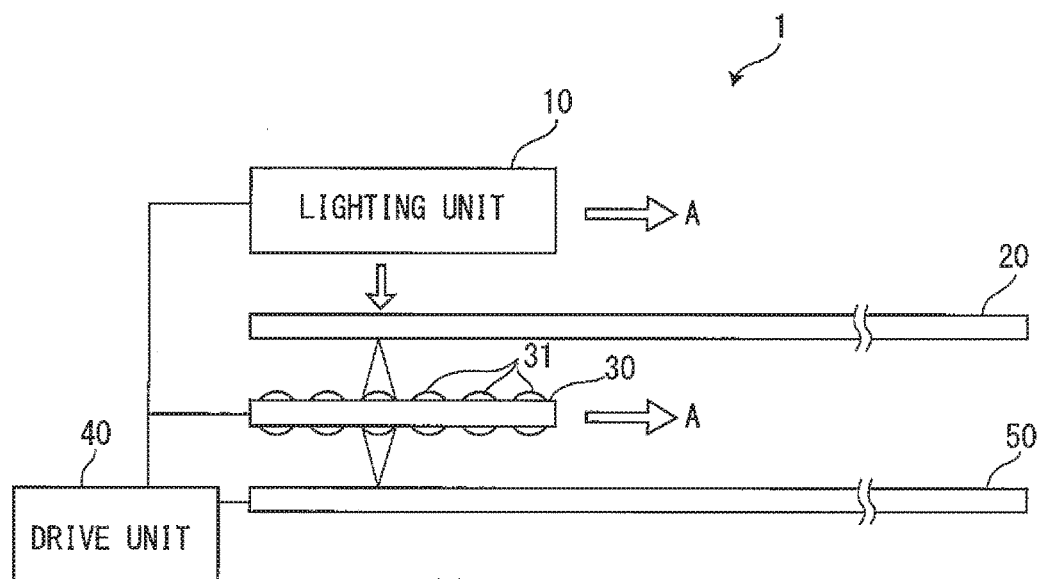
FIG. 1 is a conceptual view illustrating an example of exposure device in which microlens arrays are applied.

FIG. 1 is a conceptual view illustrating an example of exposure device in which microlens arrays are applied. An exposure device itself in which microlens arrays are applied is a well known technology, and only its outline will be described in here.

An exposure device 1 includes an lighting unit 10, a mask 20, microlens arrays 30 and a drive unit 40. A substrate 50 on which photosensitive resist is applied is loaded at a position in which the substrate 50 faces the mask 20 across the microlens arrays 30 in the exposure device 1.

The lighting unit 10 emits an exposure light flux and illuminates the mask 20 with an exposure light by the exposure light flux. An exposure pattern (Illustrations are omitted in the drawings.) is formed on the mask 20. The microlens arrays 30 include plural microlenses 31 arranged two-dimensionally therein, and forms an image of the exposure pattern on the mask 20 onto the substrate 50 while targeting the mask 20 as a subject.

Here, an exposure area by the lighting unit 10 when standing still and the microlens arrays are smaller in area compared to the mask 20 and the substrate 50, and for this reason, the drive unit 40 moves the lighting unit 10 and the microlens arrays 30 in an arrow A direction while fixing relative positions between them. With this, the substrate 50 is exposed across an entire area in a width direction thereof.

When the substrate 50 is a substrate which has a length exceeding an exposure area of one exposure with respect to a direction perpendicular to the sheet of this FIG. 1, after performing the exposure across the entire area in the width direction of the substrate 50 as describe above, the drive unit 40 moves the substrate 50 by an exposure width of the one exposure in the direction perpendicular to the sheet of this FIG. 1, and then, moves again the lighting unit 10 and the microlens arrays 30 to perform the exposure. As described, an entire area to be exposed are also exposed for a substrate having a large area.

When the exposure for the entire area of the substrate 50 is finished, the substrate 50 is unloaded form the exposure device 1, a next new substrate 50 is loaded and the above-described exposure operation is repeated.

Incidentally, the movements for the above-described exposure may be relative movements, and a configuration in which the mask 20 and the substrate 50 are moved while the lighting unit 10 and the microlens array 30 are fixed may be used.

Figure 2:
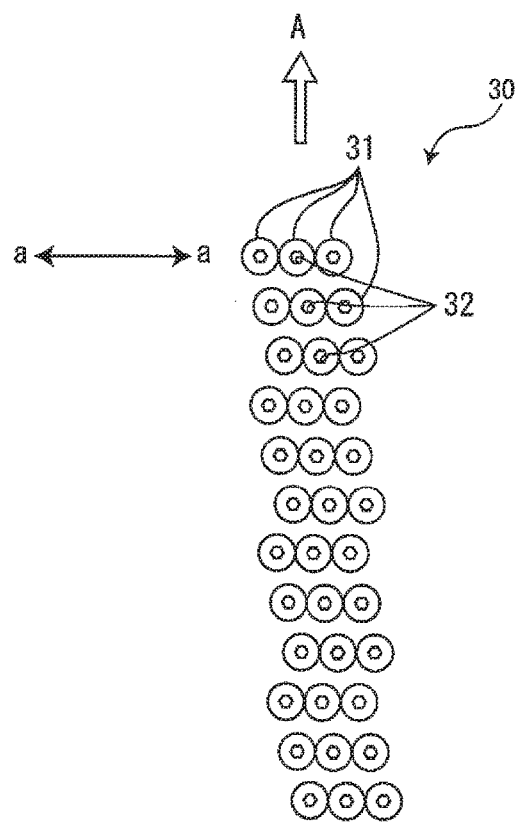
FIG. 2 is a plan view illustrating a portion of microlenses arranged in large numbers on microlens arrays.

FIG. 2 is a plan view illustrating a portion of microlenses arranged in large numbers on microlens arrays.

The microlens arrays 30 schematically illustrated in FIG. 1 include many microlenses 31 arranged therein.

Figure 3:
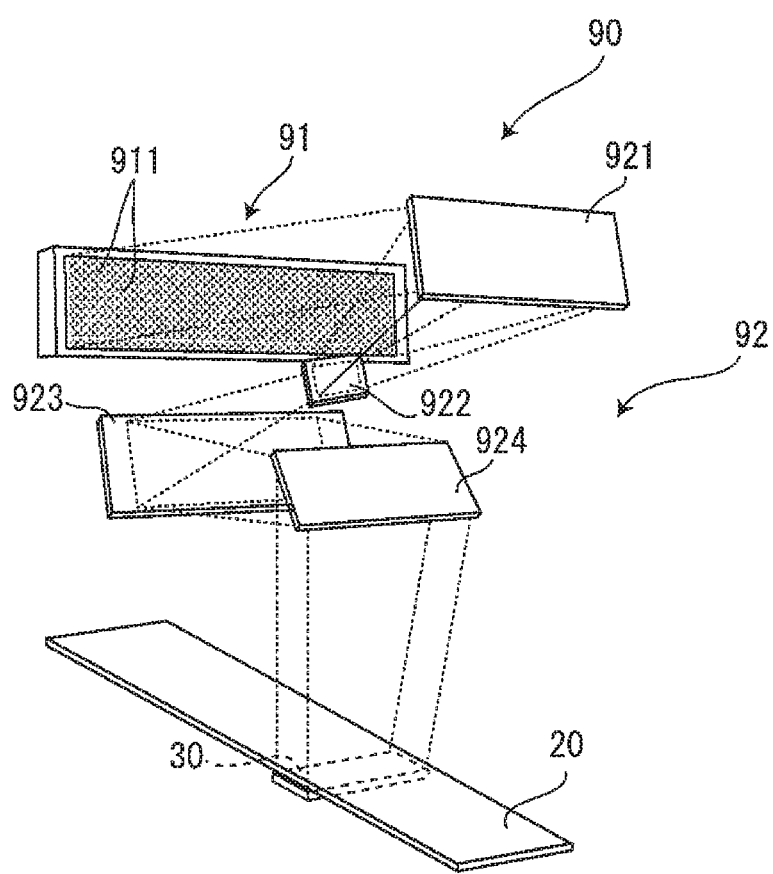
FIG. 3 is a schematic perspective view illustrating an example of lighting unit in which mercury lamps are used.

Only a small portion of the microlenses is illustrated in this FIG. 3 while being enlarged.

Similar to the arrow A illustrated in FIG. 1, an arrow A illustrated in this FIG. 2 indicates a movement direction of the lighting unit 10 and the microlens array 30 at the time of exposure.

The microlenses 31 on the microlens arrays 30 are arranged two-dimensionally while including an arrangement in an arrow a-a direction perpendicular to the movement direction A. In the present embodiment, the arrow a-a direction corresponds to an example of the intersecting direction according to the present invention.

Each of the microlenses 31 is arranged with a view diaphragm 32 having a hexagonal shape, and an effective aperture of each of the microlenses 31 is limited by this. This is for preventing distortion of an image and a decrease of a perimeter light amount due to using a perimeter area of a microlens 31.

Next, the lighting unit 10 which is a feature of the present embodiment will be explained. At first in here, as a comparative example, an example of the conventional lighting unit using mercury lamps will be explained, and then next, the lighting unit according to the present embodiment will be explained.

FIG. 3 is a schematic perspective view illustrating an example of lighting unit in which mercury lamps are used. The lighting unit illustrated in this FIG. 3 corresponds to a comparative example with respect to the present invention.

The lighting unit 90 includes a light source 91 and an lighting optical system 92. Many mercury lamps 911 are arranged two-dimensionally in the light source 91. The lighting optical system 92 has a configuration in which lights emitted from the many mercury lamps 911 included in the light source 91 are guided to an area of the mask 20 (see also FIG. 1 together) which area faces the microlens arrays 30 via a first mirror 921, a lens 922, a second mirror 923 and a third mirror 924.

In the case of the lighting unit 90 illustrated in this FIG. 3, the size reaches, as an example, up to as large as 2.4 m in width, 4.4 m in depth and 1.9 m in height.

Figure 4:
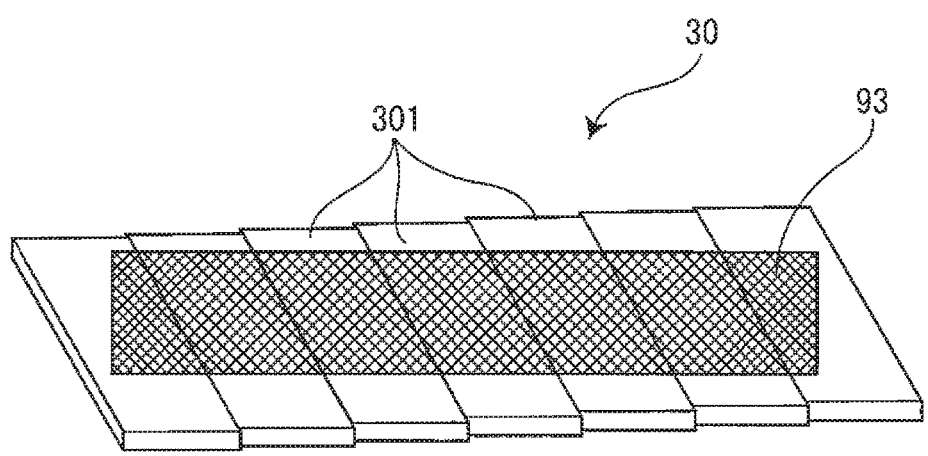
FIG. 4 is a view illustrating an lighting area on microlens arrays by the lighting unit illustrated in FIG. 3.

FIG. 4 is a view illustrating an lighting area on microlens arrays by the lighting unit illustrated in FIG. 3. The mask is omitted in here for making it easier to understand, and it illustrates as if the microlens arrays 30 are directly illuminated.

The microlens arrays 30 have a configuration in which plural pieces of unit microlens arrays 301 are arranged, and quite many microlenses (Illustrations are omitted in FIG. 4) are arranged in each of the unit microlens arrays 301.

An exposure area 93 on the microlens arrays 30 by the lighting unit 90 illustrated in FIG. 3 spreads uniformly without positional relations to individuals of the microlens arrays 31 being taken into consideration.

As explained with reference to FIG. 2, the microlenses 31 according to the present embodiment are arranged discretely with respect to the movement direction A, and in addition, in each of the microlenses 31, an effective area of exposure light which is used for the exposure to the substrate 50 is limited within each of the view diaphragms 32. For this reason, when the microlens arrays 30 are uniformly illuminated as illustrated in FIG. 4, the exposure light which is effectively used for a real exposure becomes only a small part of the lighting, and thus, the utilization efficiency is low.

Based on the above comparative example, an lighting unit according to the present embodiment will be explained in the following.

Figure 5:
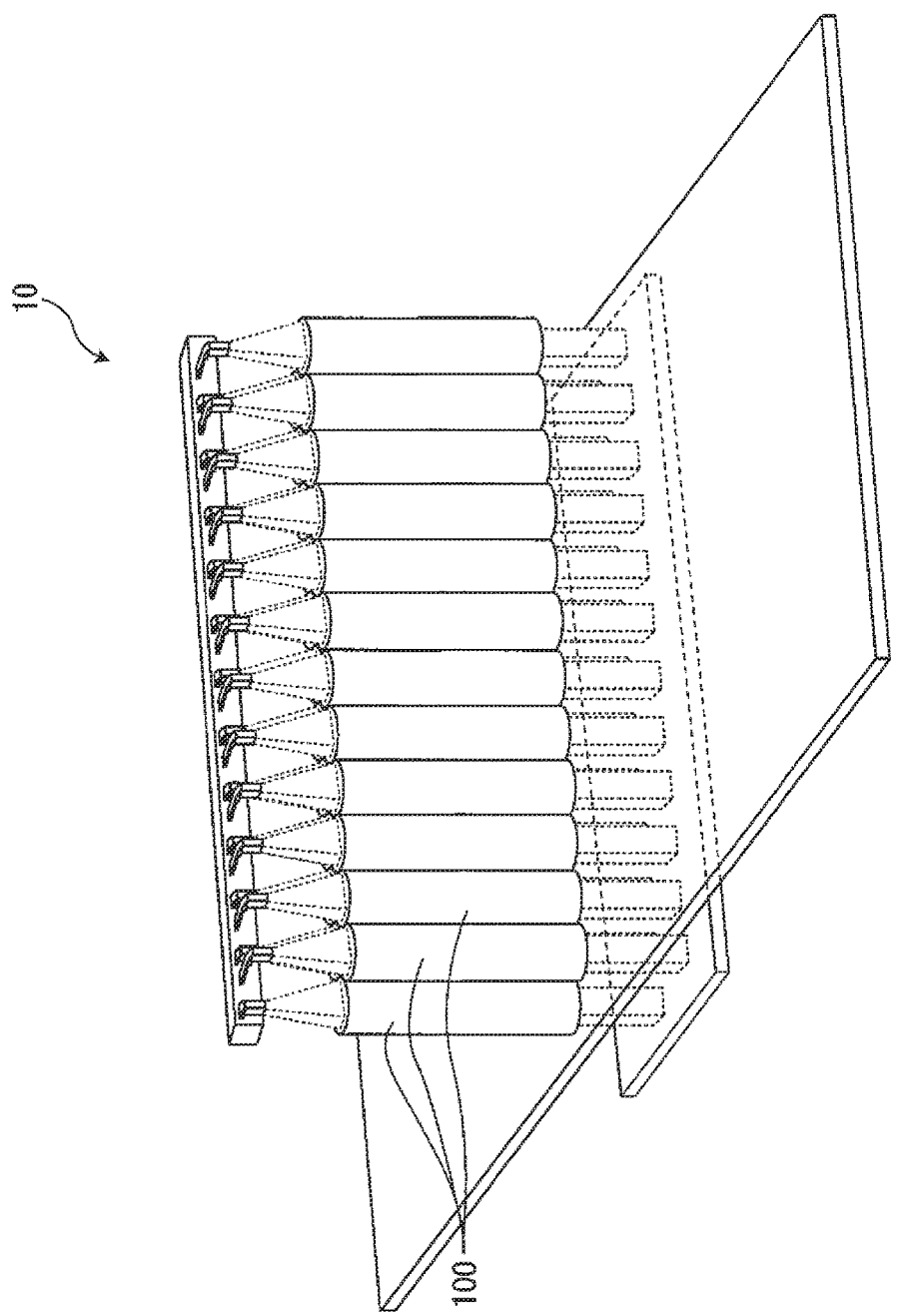
FIG. 5 is a view illustrating an outline of an lighting unit according to the present embodiment.

FIG. 5 is a view illustrating an outline of an lighting unit according to the present embodiment.

Plural lighting optical systems 100 which are arranged zigzag in two rows are illustrated in here. Although details will be explained later, plural pieces (as an example, twelve pieces in the present embodiment) of laser diode array bars (hereinafter, referred to as "LD array bar(s)") are arranged for each single piece of the lighting optical systems, and the lighting optical systems 100 produce, with respect to each one piece of the lighting optical systems, twelve exposure light fluxes each having a slit form which twelve exposure light fluxes correspond to twelve pieces of the LD array bars, and illuminate the microlens arrays 30 through the mask.

Figure 6:
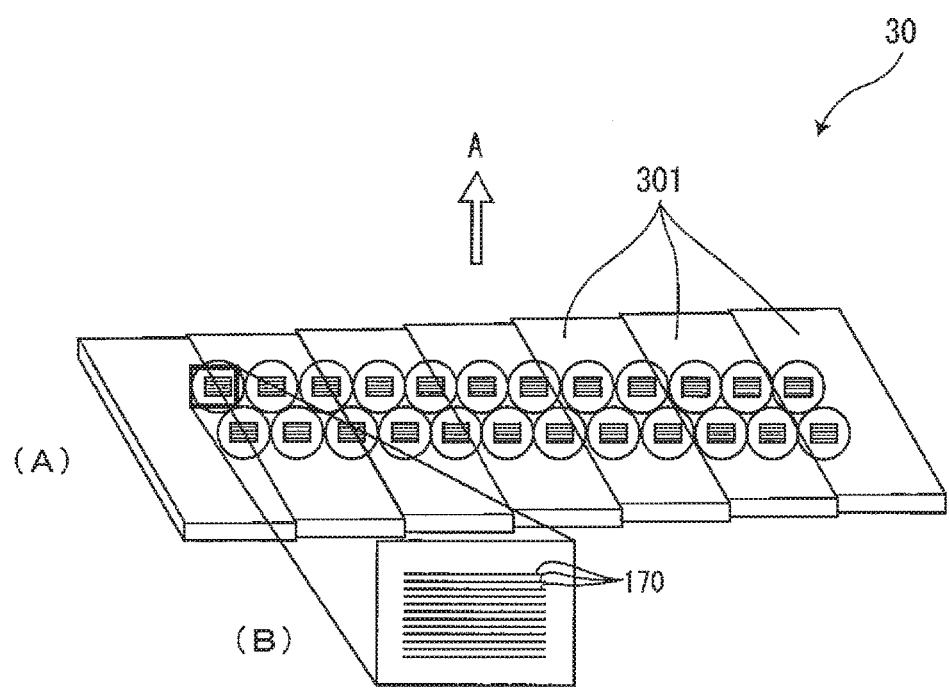
FIG. 6 is a view illustrating an lighting area on microlens arrays by the lighting unit illustrated in FIG. 5.

FIG. 6 is a view illustrating an lighting area on microlens arrays by the lighting unit illustrated in FIG. 5. An lighting area by the whole of the lighting unit illustrated in FIG. 5 is illustrated in part (A) of FIG. 6, and an lighting area by a single piece of the lighting optical systems is illustrated in part (B) of FIG. 6 while being enlarged.

The lighting unit 10 includes, as described above, the twelve pieces of LD array bars per each single piece of the lighting optical systems 100. Corresponding to those twelve pieces of LD array bars, the twelve exposure light fluxes each having the slit form per each single piece of the lighting optical systems 100 are produced and the twelve exposure lights 170 each having the slit form are emitted. Each of the exposure light fluxes is an exposure light flux which spreads across many microlenses 31 with respect to the microlenses 31 arranged in the arrow a-a direction illustrated in FIG. 2, and which is limited in an area not reaching a microlens 31 arranged in an adjacent row in the direction. The twelve exposure lights 170 by the twelve exposure light fluxes produced by a single piece of the lighting optical systems 100 illuminate twelve rows each of which rows includes many microlenses arranged in the arrow a-a direction and which are sequentially different from one another with respect to the movement direction A, respectively.

With this, an area which is not irradiated with the exposure light is formed between one exposure light 170 and another exposure light which is adjacent to the one. Accordingly, in the case of the lighting unit 10 according to the present embodiment, the utilization efficiency as the exposure light is enhanced by preventing an irradiation to a partial area which is not utilized as the exposure light. In addition, in the case of the lighting unit 10 according to the present embodiment, by applying an LD (laser diode), compared to a case in which a mercury lamp is applied, the lighting unit is made small in size and low in height.

In the following, the lighting unit according to the present embodiment will be explained in further detail.

Figure 7:
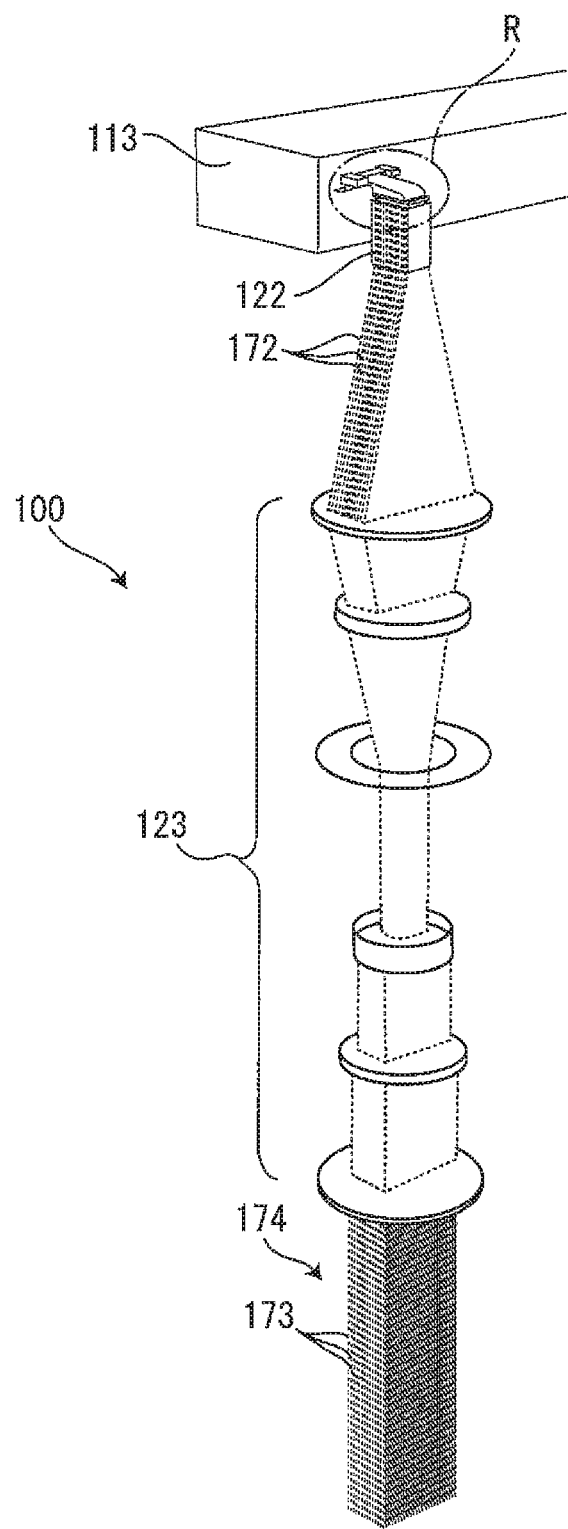
FIG. 7 is an outline view illustrating a configuration of a single piece of lighting optical unit.

FIG. 7 is an outline view illustrating a configuration of a single piece of lighting optical unit.

Figure 8:
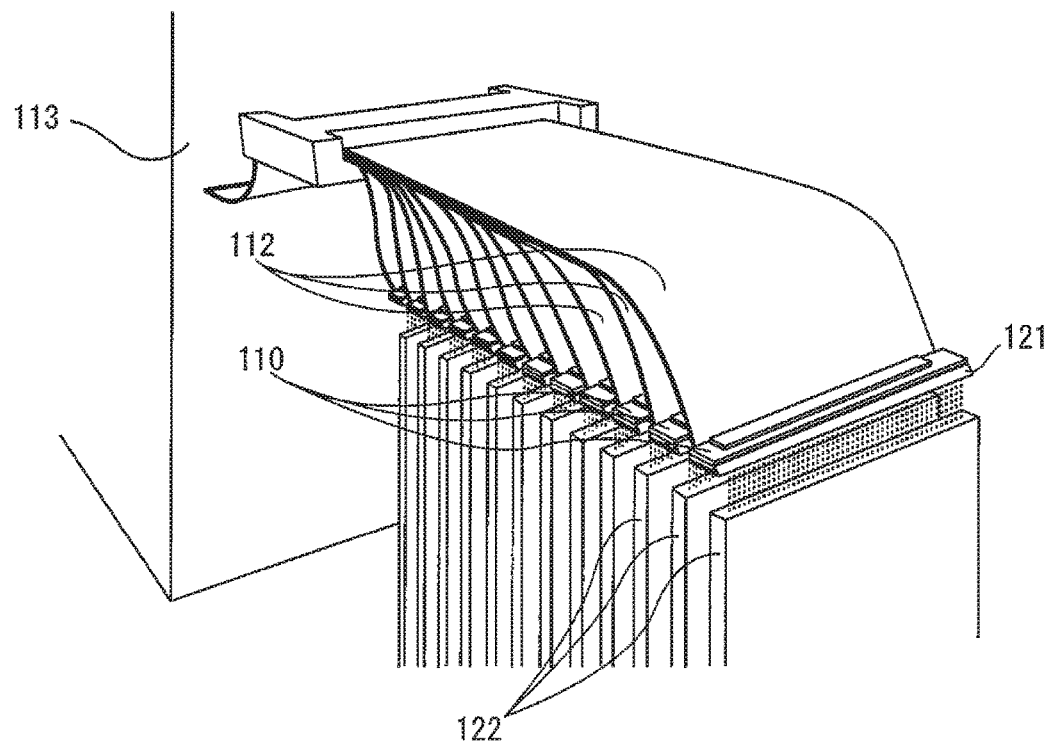
FIG. 8 is an enlarged view illustrating a portion of a circle R illustrated in FIG. 7.

In addition, FIG. 8 is an enlarged view illustrating a portion of a circle R illustrated in FIG. 7.

Figure 9:
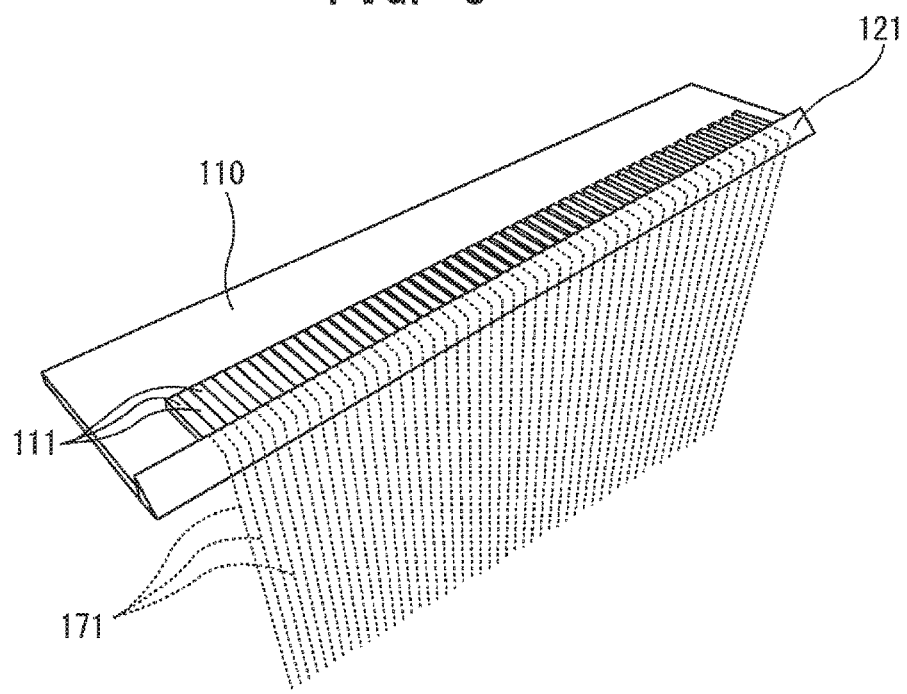
FIG. 9 is a view illustrating a single piece of LD array bar and emitted lights from the LD bar.

Further, FIG. 9 is a view illustrating a single piece of LD array bar and emitted lights from the LD bar.

An LD array bar 110 illustrated in FIG. 9 has a size of about 11 mm in length, and LD's 111 are arranged in one-dimensionally, for example, 48 pieces in a 200 μm pitch.

The LD array bar 110 corresponds to an example of the light emitting element array according to the present invention, and each of the LD's 111 arranged in the LD array bar 110 correspond to an example of the light emitting element according to the present invention.

An emitted light from each of the LD's 111 included in the LD array bar 110 is deflected downward by a reflection optical system such as a mirror, a prism and the like (a prism 121 in the present embodiment). Each of the emitted lights which are deflected downward becomes a light flux with respect to each of the respective LD's 111 as it is.

FIG. 8 illustrates a state in which plural (twelve pieces in the present embodiment) LD array bars 110 are arranged. Each of flexible boards 112 for connection with an LD array driver 113 (see FIG. 7) is connected to each of the LD array bars 110, and each of the LD array bars 110 is driven by the LD array driver 113 via each of the flexible boards 112.

In addition, as illustrated in FIG. 8, each of rod lenses 122 each corresponding to each of the LD array bars 110 is arranged below each of the LD array bars 110. Each of the rod lenses 122 corresponds to an example of the light flux transformation optical system according to the present invention. Each of the rod lenses 122 is processed to have a plate shape, and lights emitted from each of the LD array bars 100 enter an inside of a corresponding rod lens 110 from an upper end surface 122 thereof. 48 of the light fluxes 171 from 48 pieces of the LD's 111 which light fluxes 171 are incident to the corresponding rod lens 122 are mixed through refraction by the refractive index distribution in the rod lens 122 and reflections on an outer wall surface of the rod lens 122, and become a single light flux having a uniform light amount distribution to radiate from a lower end surface of the rod lens 122.

All of the twelve light fluxes 172 emitted from the respective lower end surfaces of arranged plural (twelve pieces in the present embodiment) rod lenses 122 enter a single piece of a light projection optical system 123 illustrated in FIG. 7, and are adjusted in form by the light projection optical system 123, and become a multi line beam 174 including plural (twelve) exposure light fluxes 173 which perform the lighting of the slit form as illustrated in FIG. 6 (part (B)) to radiate from the light projection optical system 123. In the multi line beam 174, as described above, the twelve exposure lights 170 (see FIG. 6) by the twelve exposure light fluxes 173 included in the multi line beam 174 illuminate the microlenses 31, row by row.

Figure 10:
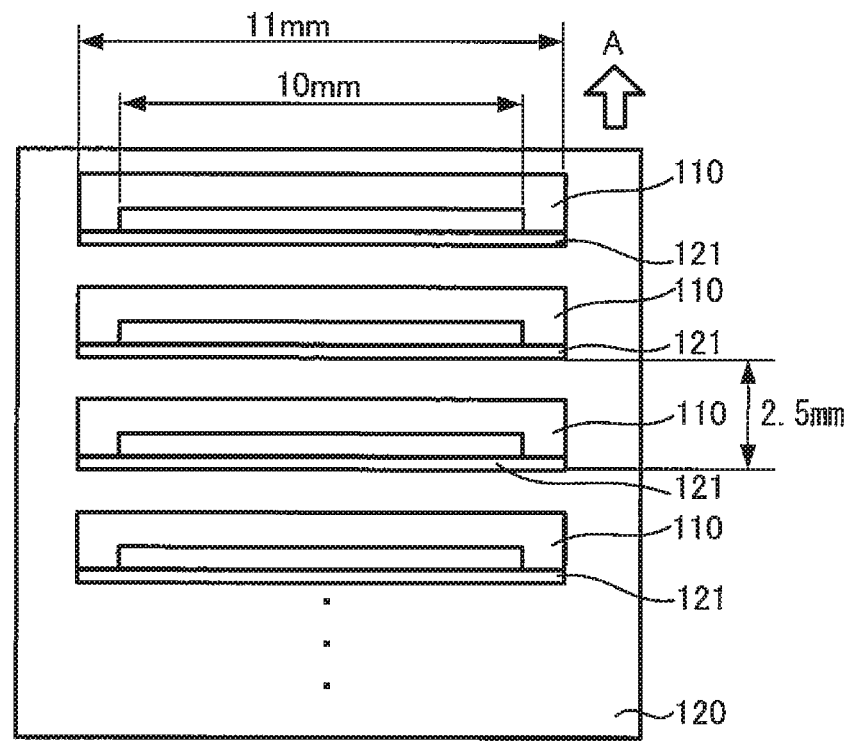
FIG. 10 is a view illustrating LD array bars arranged on a glass substrate.

FIG. 10 is a view illustrating LD array bars arranged on a glass substrate.

This FIG. 10 illustrates four pieces of the LD array bars which are a part of the LD array bars for a single piece of the lighting optical system.

These LD array bars 110 are arranged on a glass substrate 120 and are fixed on the glass substrate 120. An arrow A direction illustrated in this FIG. 10 is a direction same as the movement direction A illustrated in FIG. 1.

As illustrated in this FIG. 10, a single piece of the array bar 110 has, as an example, about 11 mm in length, and in an area of 10 mm in there, 48 pieces of the LD's are arranged in 200 μm pitch. In addition, a reflection prism 121 is arranged at a position facing an emitting surface of each of the LD array bars 110. The reflection prism 121 is also fixed on the glass substrate 120.

Figure 11:
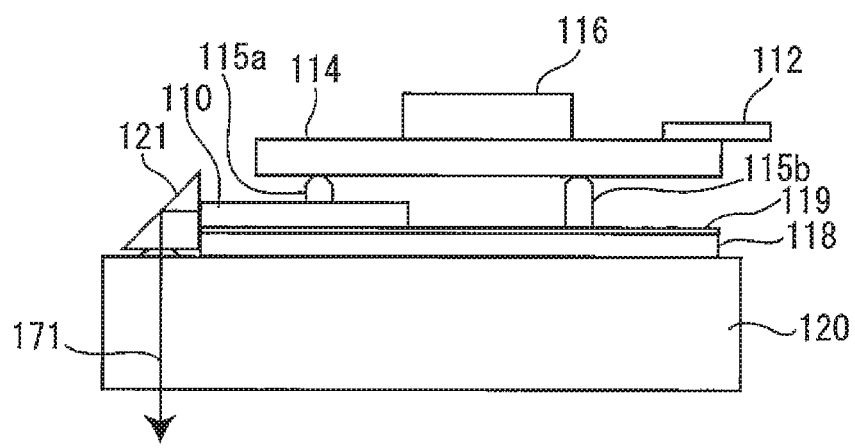
FIG. 11 is a schematic sectional view of a portion in which a single piece of LD array bar is mounted on a glass substrate.

FIG. 11 is a schematic sectional view of a portion in which a single piece of LD array bar is mounted on a glass substrate.

A sub-mount 118 is fixed on the glass substrate 120. An Au coating 119 is applied to an upper surface of the sub-mount 118. The Au coating 119 is connected to a ground terminal (not illustrated in the drawings) on a lower surface of the LD array bar 110. The LD array bar 110 is placed such that the LD array bar 110 is connected to the Au coating 119 on the sub-mount 118 and is fixed to the glass substrate 120 via the sub-mount 118.

A terminal on an upper surface of the LD array bar 110 is connected to a circuit board 114 via a flip chip 115a. In addition, the Au coating 119 on the sub-mount 118 is also connected to a ground on the circuit board 114 via the flip chip 115b. A driver IC 116 to drive the LD array bar 110 is mounted on the circuit board 114. The circuit board 114 is connected to the LD array driver 113 illustrated in FIG. 7 via the flexible board 112 (see also FIG. 8 together).

A reflection prism 121 is arranged on a side of the emitting surface of the LD array bar 110. The reflection prism 121 reflects the emitted lights from the LD array bar 110 to cause them to transmit through the glass substrate 120 and to enter the rod lens 120 having the plate shape illustrated in FIG. 8.

Figure 12:
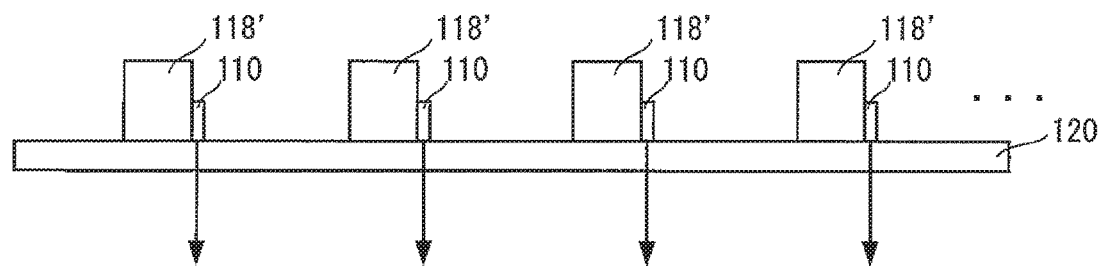
FIG. 12 is a view illustrating an another arrangement form of LD array bars on a glass substrate.

FIG. 12 is a view illustrating an another arrangement form of LD array bars on a glass substrate.

In a case of the arrangement form illustrated in FIG. 10 and FIG. 11, each of the LD array bars 110 is fixed to the glass substrate 120 in a posture in which the lights are emitted from the plural LD'S included in each of the LD array bars 110 in a direction parallel to a surface of the glass substrate 120, and are caused to be reflected by each of the reflection prisms 121 to transmit through the glass substrate 120.

In contrast, in this FIG. 12, each of the LD array bars 110 is fixed to the glass substrate 120 in a posture in which the plural LD's included in each of the LD array bars 110 emit lights toward the glass substrate 120 via each of the sub-mounts 118'.

It is illustrated in here, as being simplified as if only the LD array bars 110 are fixed to the sub-mounts 118', and however, there is included a configuration in which components similar to those in FIG. 11 except for the reflection prism 121 are assembled on each of the sub-mounts 118', and the sub-mounts 118' are stood up to be fixed to the substrate 120 such that the emitting surfaces of the LD array bars 110 face downward. The LD array bars 110 may be arranged on the glass substrate 120 as illustrated in this FIG. 12.

According to the above-described lighting unit 10 of the present embodiment, the size may be, as an example, only 0.9 m in width, 0.3 m in depth and 0.6 m in height, and significant downsizing is obtained, compared to the conventional lighting unit which is explained with reference to FIG. 3.

Figures 13A, 13B, 13C, 13D:
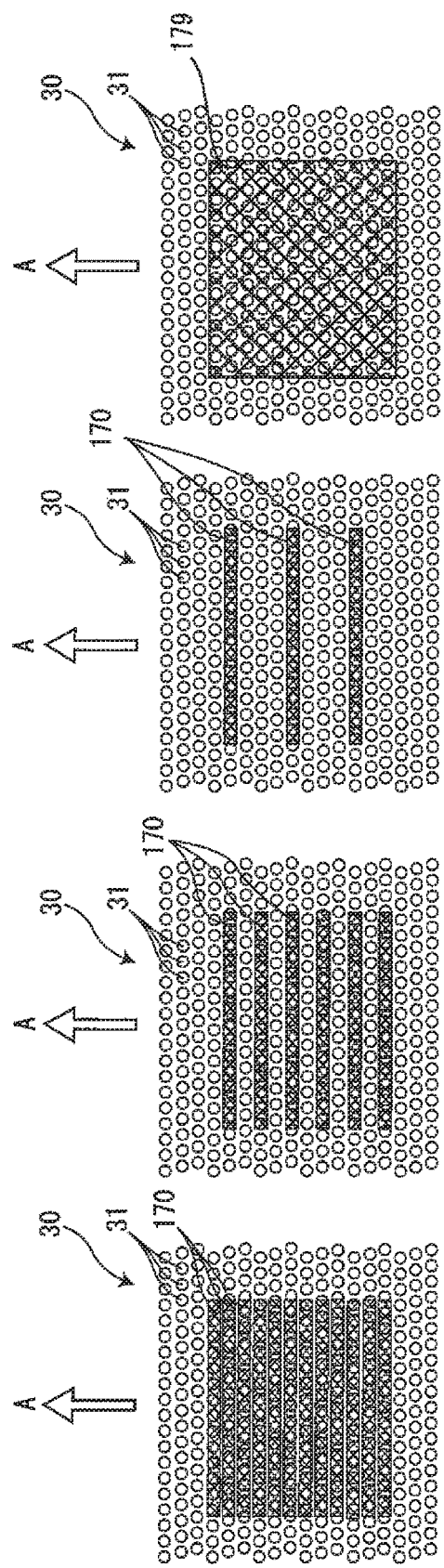
FIG. 13 is a view illustrating lighting patterns in an lighting area of a single piece of the lighting optical system.

FIG. 13 is a view illustrating lighting patterns in an lighting area of a single piece of the lighting optical system.

The movement direction A also illustrated in FIG. 1 is illustrated by an arrow A also in this FIG. 13.

As illustrated in FIG. 13, the microlenses 31 on the microlens arrays 30 are illuminated by the exposure lights 170 each having the long slit form, row by row. However, although the exposure lights 170 illuminate the mask 20 (see FIG. 1) above the microlens array 30 in terms of directly, illustrations of the mask 20 are omitted.

Part (A) of FIG. 13 illustrates a state in which the microlens arrays 30 are irradiated by the multi line beam 174 (see FIG. 7) including the twelve exposure light fluxes 173.

In addition, part (B) of FIG. 13 is a view of a state in which the arranged LD array bars are driven in alternate pieces, and emission of light from remaining alternate pieces of the LD array bars is stopped.

Part (C) of FIG. 13 is a view of a state in which only LD array bars further half the number of pieces compared to the part (B) of FIG. 13 are driven.

Part (D) of FIG. 13 illustrates, as a comparative example, an lighting area 179 same as the lighting area of which the single piece of the lighting optical system according to the present embodiment takes charge by the lighting unit 90 illustrated in FIG. 3.

According to the lighting unit 10 of the present embodiment, in order to obtain an exposure light amount same as that of the comparative example (part (D) of FIG. 13), it requires only a level of part (C) of FIG. 13 with respect to an exposure light amount for exposing the substrate 50 (see FIG. 1), and in addition, it requires only the order of a quarter with respect to the electricity consumption. When it is required to increase the exposure light amount to the substrate 50, the exposure light amount may be increased by driving further more LD array bars as part (B) of FIG. 13 or part (A) of FIG. 13.

As explained above, according to the present embodiment, the lighting unit is reduced much in size, and accordingly, the exposure device is reduced much in size, and further, the electricity consumption is decreased.

REFERENCE SIGNS LIST

1 Exposure device
10, 90 Lighting unit
20 Mask
30 Microlens arrays
31 Microlens
32 View diaphragm
40 Drive unit
50 Substrate
91 Light source
92, 100 Lighting optical system
93 Exposure area
111 LD
112 Flexible board
113 LD array driver
114 Circuit board
115a, 115b Flip chip
116 Driver IC
117, 171 Reflection prism
118, 118' Sub-mount
119 Au coating
120 Glass substrate
121 Reflection prism
122 Rod lens
123 Light projection optical system
170 Exposure light
171, 172 Light flux
173 Exposure light flux
174 Multi line beam
301 Unit microlens arrays
911 Mercury lamp
921 First mirror
922 Lens
923 Second mirror
924 Third mirror

What is claimed is:
1. An exposure device comprising:
an lighting unit that emits an exposure light;
a mask that includes an exposure pattern formed thereon and receives a radiation of the exposure light from the lighting unit;
microlens arrays that target the mask as a subject; and a movement mechanism that moves the lighting unit and the microlens arrays in a predetermined movement direction relatively to both of the mask and a substrate onto which an image of the exposure pattern on the mask is formed by the microlens arrays, wherein the exposure device exposes the substrate in a pattern according to the exposure pattern on the mask across an area on the substrate which area has a spread exceeding an exposure area of the microlens arrays when standing still through the relative movement in the movement direction by the moving mechanism, the microlens arrays include a plurality of microlenses which are arranged two-dimensionally while including an arrangement in an intersecting direction being parallel to the substrate and intersecting a moving direction relative to the substrate according to the movement direction, and the lighting unit includes:

a light emitting element array that includes a plurality of light emitting elements arranged therein; and an lighting optical system that transforms plural emitted lights emitted from the plurality of light emitting elements included in the light emitting element array into an exposure light flux which, with respect to the intersecting direction, spreads across plural microlenses arranged in the intersecting direction, and which, with respect to the movement direction, is limited in an area not reaching a microlens arranged in an adjacent row in the movement direction, and that guides the exposure light flux to plural microlenses arranged in the intersecting direction.

2. The exposure device according to claim 1, wherein the lighting unit includes plural sets of the light emitting element arrays, and the lighting optical system is an optical system which, with respect to each single set of the plural light emitting element arrays, transforms plural emitted lights emitted from a single set of the light emitting element array into a single of the exposure light flux, and guides each of the exposure light fluxes each corresponding to each of the plural sets of the light emitting element arrays to each of plural rows each of which includes the plural microlenses arranged in the intersecting direction and which are different from one another with respect to the movement direction.

3. The exposure device according to claim 1, wherein, the lighting optical system includes:

a light flux transformation optical system which is arranged according to the light emitting element array, to which plural emitted lights emitted from the plurality of light emitting elements included in the light emitting element array are incident, and which transforms the incident lights into a slit light flux having a slit form, and emits the slit light flux; and a light projection optical system to which the slit light flux emitted from the light flux transformation optical system is incident, and which transforms the incident slit light flux into the exposure light.

4. The exposure device according to claim 1, wherein the lighting unit further includes a supporting substrate to which the light emitting element array is fixed and which is made of a material allowing an emitted light emitted from the light emitting element array to transmit therethrough, and the lighting optical system includes a reflection optical system which is arranged according to the light emitting element array, is fixed on the supporting substrate to extend along the light emitting element array, and reflects plural emitted lights emitted from the plurality of light emitting elements included in the light emitting array to cause the reflected lights to transmit through the supporting substrate.

5. The exposure device according to claim 1, wherein the lighting unit further includes a supporting substrate to which the light emitting element array is fixed and which is made of a material allowing an emitted light emitted from the light emitting element array to transmit therethrough, and the light emitting element array is fixed on the supporting substrate in a posture in which plural emitted lights are emitted from the plurality of light emitting elements included in the light emitting element array toward the supporting substrate.

6. An lighting unit that, when forming an image of an exposure pattern on a mask having the exposure pattern formed thereon onto a substrate by microlens arrays and moving the microlens arrays in a predetermined movement direction relatively to the mask and the substrate, illuminates the mask while emitting an exposure light and moving in the movement direction together with the microlens arrays, wherein the microlens arrays include a plurality of microlenses which are arranged two-dimensionally while including an arrangement in an intersecting direction being parallel to the substrate and intersecting a moving direction relative to the substrate according to the movement direction, and the lighting unit includes:

a light emitting element array that includes a plurality of light emitting elements arranged therein; and an lighting optical system that transforms plural emitted lights emitted from the plurality of light emitting elements included in the light emitting element array into an exposure light flux which, with respect to the intersecting direction, spreads across plural microlenses arranged in the intersecting direction, and which, with respect to the movement direction, is limited in an area not reaching a microlens arranged in an adjacent row in the movement direction, and that guides the exposure light flux to plural microlenses arranged in the intersecting direction.

* * * * *